United States Patent [19]

Miyata et al.

[11] 3,858,233

[45] Dec. 31, 1974

[54] LIGHT-RECEIVING SEMICONDUCTOR DEVICE

[75] Inventors: Kenzi Miyata; Tatsuya Kamei, both of Hitachi, Japan

[73] Assignee: Hitachi, Ltd., Tokyo, Japan

[22] Filed: Feb. 1, 1973

[21] Appl. No.: 328,732

[30] Foreign Application Priority Data

Feb. 2, 1972 Japan ............................... 47-11381

[52] U.S. Cl. ......................... 357/30, 313/64, 313/66

[51] Int. Cl. ............................................ H01l 15/02

[58] Field of Search.... 317/235, 27 N, 27 NA, 27.1; 313/64 AB–66

[56] References Cited

UNITED STATES PATENTS

| | | | |
|---|---|---|---|
| 3,532,945 | 10/1970 | Weckler | 317/235 |
| 3,534,231 | 10/1970 | Biard | 317/235 |
| 3,676,727 | 7/1972 | Dalton et al. | 313/66 |
| 3,703,669 | 11/1972 | London | 317/235 |

*Primary Examiner*—Rudolph V. Rolinec
*Assistant Examiner*—E. Wojciechowicz
*Attorney, Agent, or Firm*—Craig and Antonelli

[57] ABSTRACT

A light receiving semiconductor device with a plurality of light receiving regions provided in one surface of a single semiconductor substrate and with light masks interposed between the light receiving regions in the surface of the semiconductor substrate.

18 Claims, 13 Drawing Figures

FIG. 4
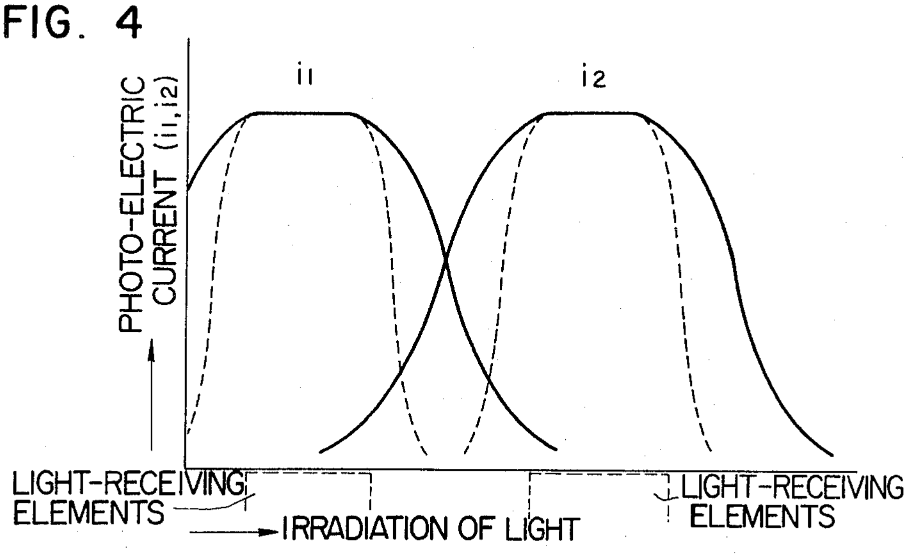
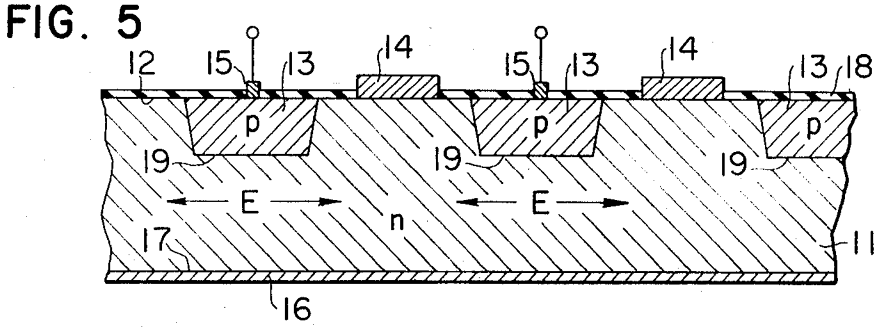
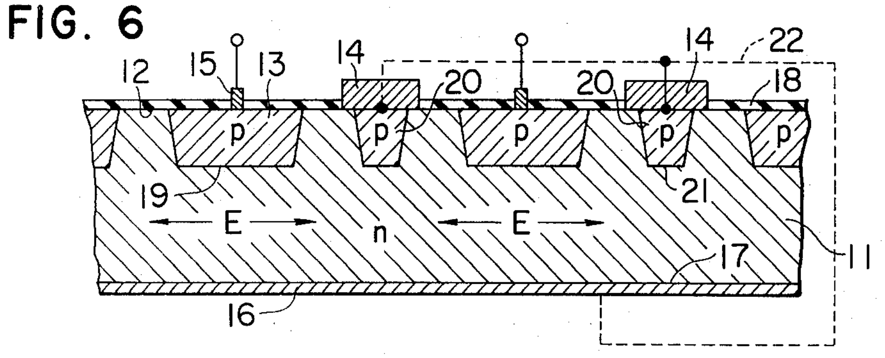
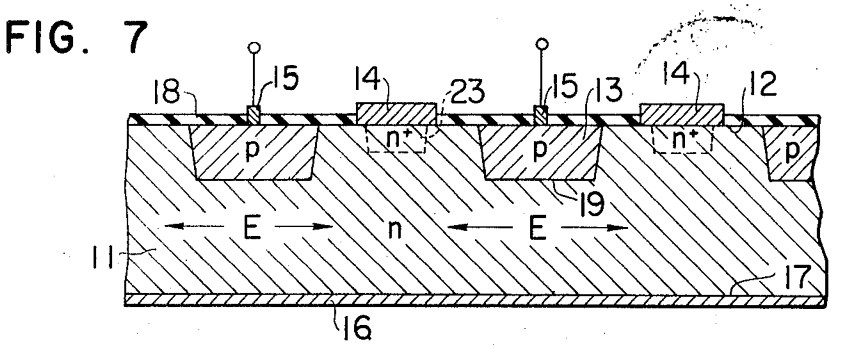

LIGHT-RECEIVING SEMICONDUCTOR DEVICE

BACKGROUND OF THE INVENTION

1. Field of the Invention

This invention relates to a light receiving semiconductor device or more in particular to a semiconductor device for converting light energy into electrical energy by taking advantage of the fact that carriers are generated in a semiconductor through light excitation by radiating light on the semiconductor.

2. Description of the Prior Art

At a time when more and more semiconductors are being introduced into the light receiving sections of the facsimile equipment and duplicators, there is a greater demand for a light receiving device with a plurality of light receiving elements arranged in a semiconductor with high density instead of a single light receiving element arranged therein. In a light receiving semiconductor device used for facsimile equipment, for example, it is necessary to form not less than eight light receiving elements inserted in the space 1 mm wide. This is rather an easy matter in a common semiconductor for conversion from electricity to electricity. But in a light receiving semiconductor device, it is likely that the other light receiving elements adjacent to light receiving elements onto which light is radiated are energized by error, and so it requires great skill to arrange 8 or more elements in the space 1 mm wide without any erroneous energization of adjacent elements.

This fact will be explained with reference to FIGS. 1, 2, 3 and 4. In FIG. 1 is shown a conventional light receiving device in which a plurality of regions 3 of a conductivity type different from that of the semiconductor substrate 1 are arranged in the substrate such that the surfaces of the regions are exposed to one main surface 2 of the substrate 1 so as to form a plurality of light receiving elements E acting as a photo-diode in a single semiconductor substrate. Reference numeral 4 shows one main electrode in ohmic contact with the surface of the region 3 and numeral 5 the other main electrode in ohmic contact with the main surface 6.

When light enters the main surface 2, surplus electron-hole pairs are generated by light excitation. If light of an energy larger than the one corresponding to the forbidden band width of the semiconductor enters, the light is completely absorbed in the neighborhood of the surface of the semiconductor substrate due to the high absorption factor of the semiconductor. On the other hand, light slightly larger in energy than the forbidden band width enters deep into the semiconductor substrate thereby to form electron-hole pairs. In any case, since the intensity of light becomes lower the deeper it penetrates into the substrate, the density of the electron-hole pairs is a maximum at a point near the surface of the semiconductor substrate. It is apparent from FIG. 2 how such surplus electron-hole pairs are distributed in the semiconductor substrate with a *p-n* junction 7 therein. In this figure, curves a and b respectively show the distribution of the surplus electron-hole pairs in the regions between the light receiving elements E and in the light receiving elements themselves when the *p-n* junctions are reverse-biased. The electrons and holes generated in the depletion layer of the light receiving elements E are moved quickly to the *n*-type region and *p*-type region respectively due to the presence of a drift field in the depletion layer. As a result, as shown by curve b, the density of the electron-hole pairs present near the depletion layer is very low under normal conditions. The movement of electrons and holes due to the drift field produces an output of the light receiving elements E in the form of a photo-electric current.

Generally, the depletion layer is present only in the neighborhood of the *p-n* junction, while on the other hand the electron-hole pairs are generated over the whole area of the semiconductor substrate. The electron-hole pairs generated in regions other than the depletion layer either disappear due to a limited lifetime thereof or moves to the depletion layer by diffusion thereby to become a drift current, contributing to the generation of photo-electric current. In other words, the photo-electric current generated when the *p-n* junctions are reverse-biased is the sum of the current due to the electronhole pairs generated in the depletion layer and the photo-electric current resulting from the diffusion, to the depletion layer, of the electron-hole pairs generated in the regions other than the depletion layer. Thus, the area in the neighborhood of the *p-n* junction where the depletion layer is present functions as a suction for the electron-hole pairs.

In order to convert the incident light efficiently into photo-electric current, it is necessary for the depletion layer to absorb as many electron-hole pairs as possible. This purpose is effectively achieved by extending the life time of the electron-hole pairs thereby to enlarge the diffusion length L. Here, L is given as $\sqrt{D\tau}$, where $\tau$ is the average lifetime of the electron-hole pairs, D the diffusion factor which depends on the material involved and the temperature, and L the average distance over which the electron-hole pairs move in the semiconductor without being extinguished. Therefore, L makes up a measure by means of which it is possible to know from how far the depletion layer is able to absorb the carriers.

Arranging a plurality of the above-described light receiving elements in a single semiconductor substrate poses a problem. This is typically illustrated by an experiment shown in FIG. 3. In this figure where the light-receiving semiconductor device is the same as the one shown in FIG. 1, a power supply is inserted between one of the main electrodes 4 and the other electrode 5 in such a manner as to reverse-bias the *p-n* junctions 7. An amperemeter A is connected between the power supply 8 and one of the main electrodes 4 to detect the photo-electric current flowing in the light-receiving elements E. Under this condition, a light spot is moved over the one main surface 2 of the semiconductor substrate 1, say, from left to right in the drawing by the light condenser 9, and the resulting photo-electric current, flowing in the amperemeter A as shown in FIG. 4 can be obtained. From this, it will be seen that the photo-electric current is maintained at a fixed level when the region 3 is irradiated, while on the other hand it is reduced as the light spot goes away from the region 3. The reason why the photo-electric current flows even when areas distant from the region 3 are irradiated is because the depletion layer is extended to such areas as are distant from the junction and especially that the electron-hole pairs present outside of the depletion layer are moved by diffusion to the depletion layer. As a consequence, solid lines representing the photo-electric current in the adjacent light receiving elements E cross each other as shown in FIG. 4, resulting in a lower ability to distinguish the position of the light spot, that is, a reduced resolution. This causes an obscure image when the device is applied to, say, the fascimile equipment.

Therefore, if a plurality of light receiving elements are to be arranged closely in a single semiconductor substrate, it is necessary to develop a means to eliminate the mutual effect of the light receiving elements E. A well known means for this purpose is to diffuse gold atoms other elements for formation of recombination centers between the light receiving elements E or to provide grooves therebetween. Under the circumstances, however, it is technologically almost impossible to diffuse gold or form grooves between the light receiving elements E.

SUMMARY OF THE INVENTION

Accordingly, it is an object of the present invention to provide a unique light receiving semiconductor device which obviates the above-mentioned problems.

Another object of the invention is to provide a light-receiving semiconductor device with a high resolution in which a plurality of light receiving elements are arranged closely in a single semiconductor substrate.

Further object of this invention is to provide a light receiving semiconductor device with a high light sensitivity in which a plurality of light receiving elements are arranged clarely in a single semiconductor substrate.

BRIEF DESCRIPTION OF THE DRAWING

FIG. 4 is a characteristic diagram showing the relationship between the positions of a light spot and the photo-electric current.

FIG. 5 is a diagram showing a sectional view of a typical embodiment of the invention.

FIG. 6 is a diagram showing sectional view of a first embodiment of the present invention.

FIG. 7 is a diagram showing a sectional view of a second embodiment of the present invention.

DESCRIPTION OF PREFERRED EMBODIMENTS

Figure 1:
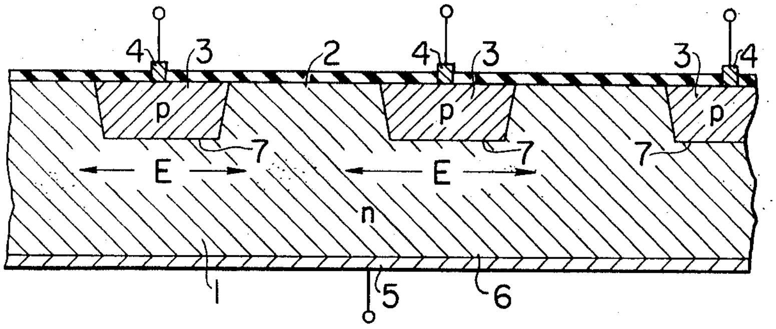
PRIOR ART FIG. 1
FIG. 1 is a diagram showing a sectional view of the prior art light-receiving semiconductor device.
Figure 2:
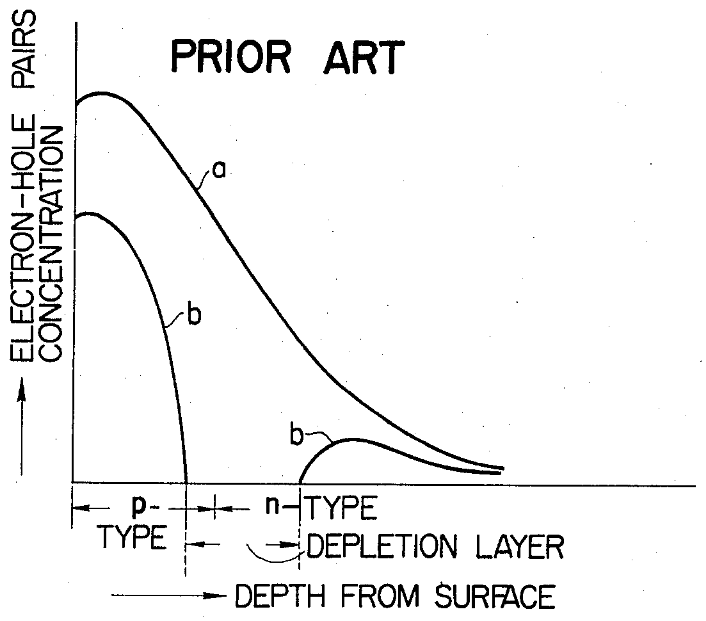
FIG. 2 is a characteristics diagram showing the distribution of the electron-hole pairs in the device of FIG. 1.

The light receiving semiconductor device according to the present invention will be now explained in detail with reference to the embodiments shown in the drawings.

First, reference is made to the typical embodiment of the invention shown in FIG. 5. A plurality of regions 13 of a conductivity type different from that of the semiconductor substrate 11 are arranged in the substrate such that the surfaces of the regions are exposed to one main surface of the substrate 11. The *p-n* junctions 19, the edge of each of which is exposed to the one main surface, are provided between the respective regions 13 and the semiconductor substrate 11. Films 14, through which light, as an exciting signal for a light receiving device, is not substantially transmitted along the part in which the respective regions 13 are opposed, are provided between the adjacent regions 13 on the one main surface 12, which is used as a light receiving surface for the semiconductor substrates. As is shown in FIG. 5, there are provided films 14 apart from the exposed edges of the *p-n* junctions. In other words, the light is applied to the side of the substrate where the regions of an opposite conductivity to the substrate are exposed. Reference numeral 15 shows main electrodes in ohmic contact with the respective surfaces of the regions 13, numeral 16 the other common main electrode in ohmic contact with the main surface 17 and numeral 18 a light permeable film of such a material as silicon dioxide which covers the main surface 12 except those portions of the surface provided with the one main electrodes 15 and the films 14. Reference symbol E shows a light-receiving element having a function such as that of a diode, which consists of a region 13 and a region which surrounds the region 13 and is disposed in the neighborhood thereof. The one main surface 12 is disposed directed towards a light source producing a light signal.

Figure 3:
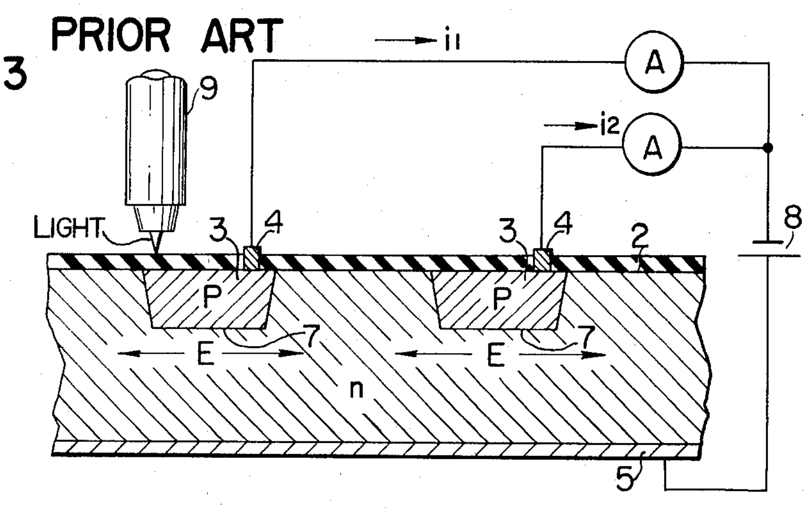
FIG. 3 is a diagram showing the manner in which the resolution of the light-receiving semiconductor device in measured.

In this device, light entering the substrate by way of the one main surface 12 passes through the light permeable film 18 and thereby surplus electron-hole pairs are generated in that portion of the semiconductor substrate covered with the film 18, while on the other hand no electron-hole pairs are produced in that portion of the substrate covered with the film 14 which has the feature that light is not substantially transmitted. Accordingly, when light is irradiated while applying a voltage between the main electrodes in such a manner as to reverse-bias the *p-n* junctions 19, the photo-electric current in the light receiving elements E is limited to the one generated by the electron-hole pairs caused by the light irradiated in the immediate neighborhood of the light receiving elements E. In this connection, the results of experiments by the method illustrated in FIG. 3 show that the relationship between the photo-electric current in each light receiving element E and the position of the light is represented by dotted lines of FIG. 4. It will be seen from this that each light receiving element generates photo-electric current exactly in the amount corresponding to the amount of light irradiated, resulting in a higher resolution, which in turn makes it possible to reproduce a clear image in the facsimile equipment and duplicators. In the process of the manufacture of the device, the film 14 is formed in such a manner as not to cover the *p-n* junction of each light receiving element and also to surround the boundaries of the *p-n* junction. Further, the films 14 are provided between the neighboring light-receiving elements E, and so as to surround each of the light-receiving elements for a light-receiving device having a plurality of light-receiving elements arranged in an array and for that having a plurality of light-receiving elements in a matrix formation, respectively. As a material for the film 14, metal, semiconductor or inorganic oxide including metal and semiconductors may be employed. There are some inorganic oxides which transmit light, and when they are employed, it is necessary not only to form protrusions and recesses on the surface of the film 14 so as to reflect the incident light, but also to make the film discontinuous so as to prevent the incident light from reaching the light receiving element if the film acts as a surface-stabilizing film at the same time. In this case, it is needless to say that a material that does not pass the light should preferably be employed. When the irradiated light has a certain wavelength, it is of course preferable that a material which does not pass the light is employed. If the irradiated light has a certain wavelength, a material not permeable to the light is preferably employed. For example, if an ultraviolet ray is involved, the material recommended is a gallium arsenide compound semiconductor or germanium. It is easy to form such a film with high precision by photo-etching without any manufacturing problems.

A first embodiment of the present invention is shown in FIG. 6 in which it will be seen that, different from the embodiment of FIG. 5, isolated regions 20 of a conductivity type different from that of the semiconductor substrate 11 covered with the film 14 is exposed to the one main surface 12 of the substrate 11. Each of the isolated regions 20 forms a *p-n* junction with the semiconductor substrate 11. This p-n junction 21 is placed between the adjacent light-receiving element and apart from the *p-n* junction 19. The formation of the *p-n* junction in turn causes an electric field to be applied from the *n* region to the *p* region due to the built-in voltage or diffusion voltage. As a result, the surplus electron-hole pairs present in the neighborhood of the *p-n* junction are divided into electrons and holes, so that electrons and holes are collected at the *n* and *p* regions respectively. In this way, most of the electron-hole pairs present in the neighbourhood of the isolated region or in the areas other than the light receiving elements E are retained at the *p-n* junction formed by the isolated region 20.

It will be understood from the above explanation that the arrangement of FIG. 6 permits the light receiving elements E to produce a photo-electric current in response to the amount of irradiated light more accurately than in the device of FIG. 5, resulting in a semiconductor light receiving device of a higher resolution.

On the other hand, it is difficult for leakage current to flow in the peripheral portion of the isolated region 20, and the above-mentioned accuracy with which the photo-electric current is produced is not expected when the isolated region 20 is small or when surplus electron-hole pairs are present in the neighborhood of the isolated region 20. In other words, in such a case, even if the movement of electrons or holes occur sufficient to strike a balance with the diffusion voltage, residual electron-hole pairs contribute undesirably to the photo-electric current in the light receiving elements E.

This problem may be solved either by forming the film 14 as a conductive material larger than the isolated region 20, or by electrically connecting the isolated region 20 to the adjacent isolated regions by the lead wire shown by the dashed line. As is shown in FIG. 6, film 14 is provided apart from the exposed edge of the p-n junction 19 of the light receiving element E. By so doing, an infinite amount of holes are capable of being absorbed into the isolated region 20, so that it is possible to extinguish all the surplus electron-hole pairs present in the neighborhood of the isolated region 20.

The resolution of the device is further improved by providing a film opaque to the transmission of light in that portion of the surface of the substrate intermediate to the light receiving elements and also by electrically connecting the isolated regions under the film.

A second embodiment of the present invention is shown in FIG. 7, in which it is seen that the film 14 of a conductive material is in ohmic contact with the semiconductor substrate 11. A recommendable material for the film 14 may be a metal or a metal containing impurities which forms an alloy with the semiconductor substrate and presents the same conductivity type as the substrate, such as aluminum, indium, gold-antimony, gold-boron, gold-gallium. In order to achieve a satisfactory ohmic contact, it is recommended that a region 23 of a high impurties concentration and which is of the same conductivity type as that of the semiconductor substrate 11 should be formed by diffusion of other method prior to the formation of the film 14. As is shown in FIG. 7, the region 23 and the film 14 are provided apart from the exposed edge of the *p-n* junction 19 of the light-receiving element E.

The ohmic contact between the film 14 and the semiconductor substrate 11 provides a region where there are numerous recombination centers. Therefore, by forming ohmic contact regions in that portions of the surface of the substrate between the adjacent light receiving elements E, the number of electron-hole pairs in the neighborhood of the ohmic contact is reduced to almost zero, thereby to form a concentration gradient of the electron-hole pairs for the other regions, so that the surplus electron-hole pairs present between the adjacent light receiving elements E are absorbed into the ohmic contact regions. As a result, the same advantage as that in the preceding embodiment is obtained. Also, the presence of numerous recombination centers in the ohmic contact region eliminates the need for the electrical connection between the semiconductor substrate 11 and the film 14.

Figure 8:
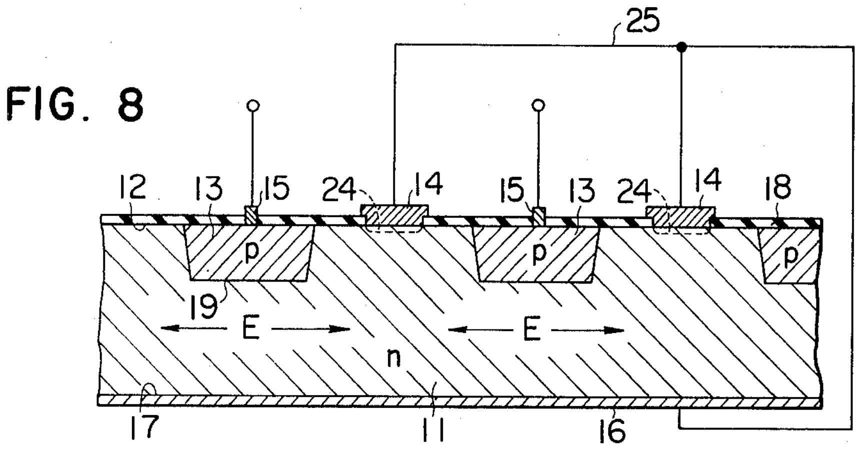
FIG. 8 is a diagram showing a sectional view of a third embodiment of the present invention.

A third embodiment of the present invention is shown in FIG. 8, from which it will be seen that the film 14 in FIG. 5 is made of a conductive material and a Schottky barrier 24 is formed between the conductive material and the semiconductor substrate 11. As is shown in FIG. 8, film 14 is provided apart from the exposed edge of the *p-n* junction 19 of the light receiving element. As is well known, the Schottky barrier is formed by depositing on the surface of the semiconductor substrate a film of aluminum, tungsten, molybdenum or the like metal or by depositing on the surface of the semiconductor substrate and treating by heat gold, platinum chromium or the like metal.

The Schottky barrier, like the p-n junction 21 shown in FIG. 6, causes electron-hole pairs generated therein and those pairs entered it from outside to move through the drift field in the Schottky barrier, whereby they flow out in the form of electric current to an external circuit and are extinguished. The external circuit with the lead wire 25 is not needed when the Schottky barrier is short-circuited by the film 14 or when there is a great leakage current in the Schottky barrier or when there are not so many surplus electron-hole pairs. In this way, the embodiment of FIG. 8 provides the same advantage as the preceding embodiments.

Figure 9:
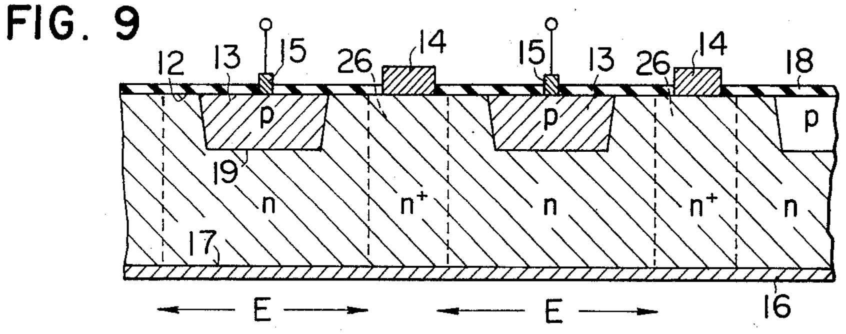
FIG. 9 is a diagram showing a sectional view of a fourth embodiment of the present invention.

FIG. 9 illustrates a fourth embodiment of the present invention which is characterized by the $n^+$-type isolated region 26 of a high impurities concentration provided between the adjust light receiving elements E. As is shown in FIG. 9, the $n^+$-type isolated region 26 is provided apart from the exposed edge of the p-n junction 19 of the light receiving element E. This is a construction desirable when the semiconductor substrate is of $n$-type conductivity. In this embodiment, the holes generated in the $n$-type region are repulsed at the boundary between the $n$-type region and the $n^+$-type region and therefore most of the electron-hole pairs generated in the light-receiving elements E enter the depletion layer in the neighborhood of the $p$-$n$ junction thereby to improve the photo-sensitivity. Also, since the lifetime of carriers in the $n^+$-type isolated region 26 is short, electron-hole pairs that may be generated by light entering it does not affect the light receiving regions E, resulting in an improved resolution. In the drawing, the isolated region 26 is seen to have been formed all the way from side to side of the semiconductor substrate, but it may be formed only to an appropriate depth toward the other main surface from the light receiving side of the substrate. The resolution of the light receiving device is capable of being further improved by combining the above-mentioned methods with the means described with reference to FIGS. 5, 7 and 8, that is, by providing an appropriate light shading mask 14 between the light receiving elements to prevent electron-hole pairs from being generated in the isolated region.

Figure 10:
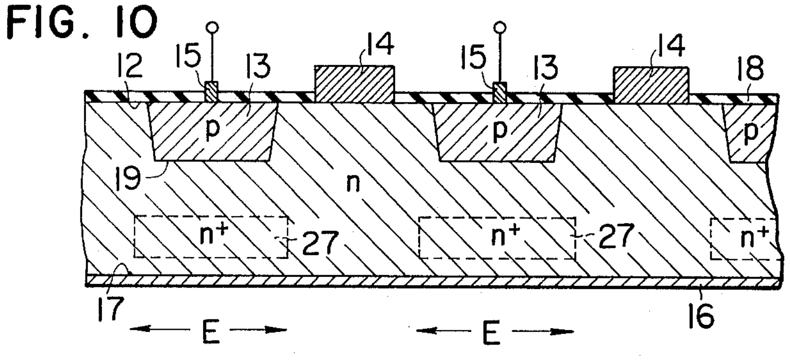
FIG. 10 is a diagram showing a sectional view of a fifth embodiment of the present invention.

A fifth embodiment of the present invention will be now explained with reference to FIG. 10. This embodiment is characterized by $n^+$-type buried regions 27 formed in the $n$-type region of the light receiving element. In this embodiment, electron-hole pairs, if within the light receiving elements, are reflected on the boundry between the $n$-type region and the $n$-type region and concentrated in the $p$-$n$ junction, thereby to contribute to an increased photo-current and hence increased photosensitivity. On the other hand, outside of the light receiving elements where there are only $n$-type regions, the electron-hole pairs are not repulsed but move away from the $p$-$n$ junction and are extinguished, resulting in a difference in the concentration of electron-hole pairs in and outside of the light receiving elements thereby to improve the photo-sensitivity and resolution of the device. In this case, too, the photo-sensitivity and resolution of the device are improved by combining the means employed in the embodiments of FIGS. 1, 2, 3 and 4 with those used in the present embodiment, such as by forming an appropriate light shading mask 14. It is possible to form the buried region 27 by the use of the buried diffusion technique commonly employed in the manufacture of integrated circuits.

Figure 11:
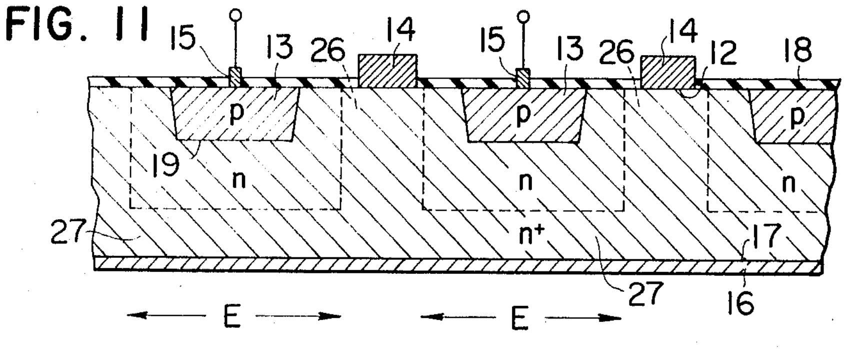
FIG. 11 is a diagram showing a sectional view of a sixth embodiment of the present invention.

Reference will be made to a sixth embodiment shown in FIG. 11. This embodiment is characterized by the fact that an $n^+$-type region 27–26 is formed between the n-type region of the light receiving element and the other main surface of the substrate and also between the light receiving elements as a combination of the embodiments of FIGS. 9 and 10. In this way, a light receiving device with the added advantages of improved photo-sensitivity and resolution can be obtained. In this case, the object of the invention is achieved without connecting the $n^+$-type region in the light receiving element and that between the light receiving elements or without forming the $n^+$-type region in such a manner as to reach the other main surface 17 of the substrate. The advantage of the present embodiment is made more conspicuous by introducing the means employed in the embodiments of FIGS. 5, 7 and 8 for improved photo-sensitivity and resolution, that is, by additionally forming an appropriate light shading mask 14.

The above description presupposes a plurality of photo-diodes arranged in the semiconductor substrate as light receiving elements, but the present invention is not limited to such embodiments, light receiving elements other than photo-diodes such as photo-transistors, photothyristors or the like being employable without any adverse effect on the advantages of the present invention.

Figure 12:
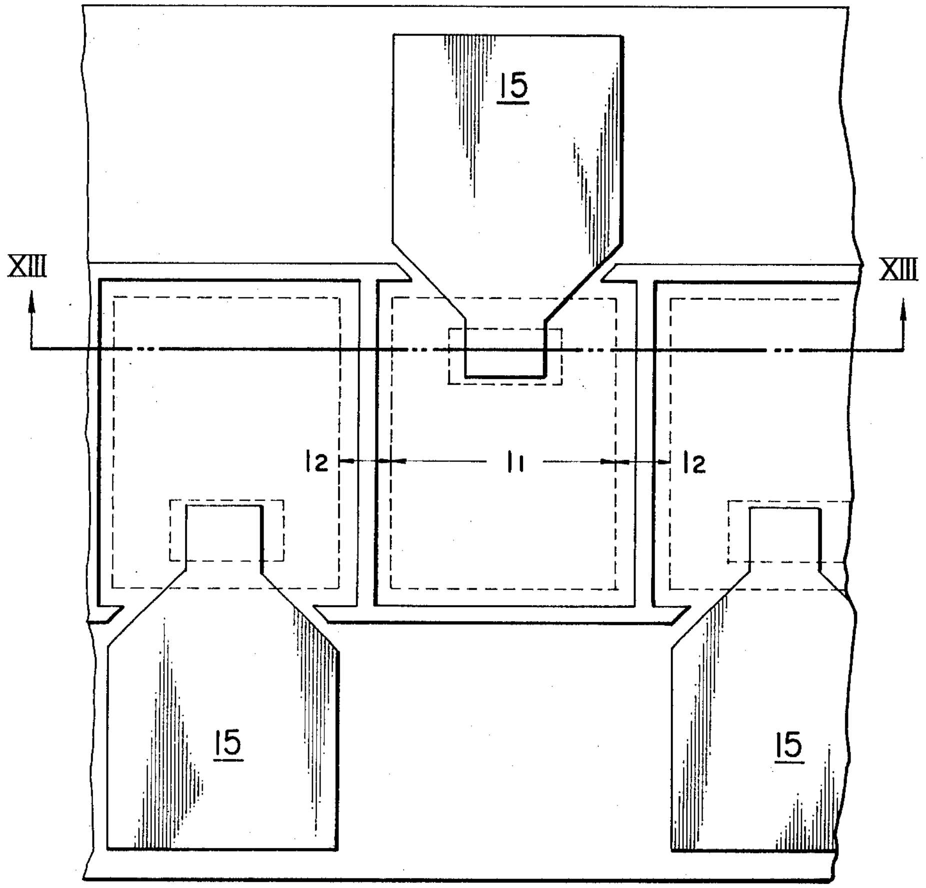
FIG. 12 is a diagram showing a plan of part of a seventh embodiment of the present invention.
Figure 13:
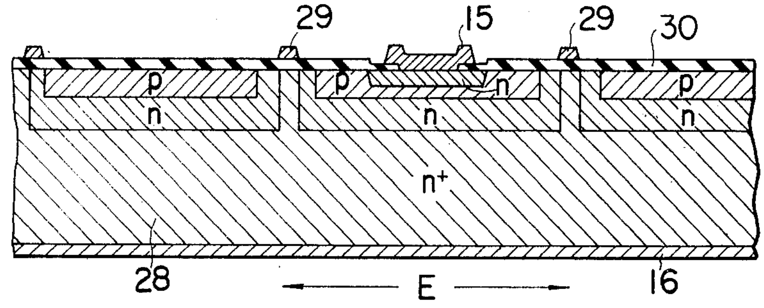
FIG. 13 is a sectional view taken in line XIII — XIII of FIG. 12.

An enlarged view of a seventh embodiment of the invention employing photo-transistors is shown in FIGS. 12 and 13. As will be apparent from the drawing, the present embodiment consists of a combination of the embodiment of FIGS. 5 and 11, that is to say, each light receiving element is surrounded by the $n^+$-type region on its three sides except the light receiving face thereof, while a film 29 of low light permeability is provided on the surface of the $n^+$-type region between the adjacent light receiving elements. Reference numeral 30 shows a silicon dioxide film covering the main surface of the semiconductor substrate to which light enters. The advantages of this embodiment which are the same as those of the preceding ones will be explained with reference to numerical values. According to the present embodiment, eight light receiving elements each 100 microns wide and with interval lengths of 25 microns therebetween are capable of being formed in the portion 1 mm wide of the substrate, making up a sufficiently practicable light receiving semiconductor device. In this case, light entering between the light receiving elements has an effect on the elements on both sides in the absence of the $n^+$-type region 28 and the film 29 unless the interval between the light receiving elements is lengthened to 75 microns. Therefore if the light receiving area of photo-sensitivity is maintained contact, not more than six light receiving elements are capable of being formed in the space 1 mm wide, resulting in a low resolution while on the lower hand if the resolution is maintained fixed, it is required that the light receiving area should be reduced by half, resulting in a great reduction in photo-sensitivity. This all tells that the light receiving device according to the present invention offers a decided advantage.

It will be thus seen that the objects set forth above, among those made apparent from the preceding description, are efficiently attained, and since certain changes may be made in the above constructions without departing from the spirit and scope of the invention, it is intended that all matter contained in the above description or shown in the accompanying drawings, shall be interpreted as illustrative and not in a limiting sense.

We claim:

1. A light receiving semiconductor device comprising a semiconductor substrate of $n$-type conductivity including a plurality of light receiving elements each having at least first and second semiconductor regions of opposite conductivity type forming at least one p-n junction therebetween, said light receiving elements being arranged in a certain spaced relationship with each other, each of said light receiving elements having its light receiving face exposed to one of the surfaces of said semiconductor substrate and the edge of said at least one *p-n* junction being exposed thereto;

an *n*-type region of a higher impurity concentration than said semiconductor substrate, said *n*-type region being formed in said semiconductor substrate at least a portion of which is disposed beneath the surface of each of said light receiving elements which is directly opposite to that respective surface portion by way of which light enters; and a couple of electrodes each in ohmic contact with a respective one of said first and second regions of each of said light receiving elements.

2. A light receiving semiconductor device comprising: a semiconductor substrate including a plurality of light receiving elements arranged in a certain spaced relationship with respect to each other, each of said light receiving elements having a light receiving side exposed to one of said main surfaces of said semiconductor substrate, each of said light receiving elements including a first region of one conductivity type, a second region of the conductivity type opposite to that of said first region, and at least one p-n junction formed between said first region and said second region, said second region being adjacent to said first region and the edge of the p-n junction being exposed to said one of said main surfaces;

a plurality of films each formed all over the opposed portion between said light-receiving elements and apart from said edge of the *p-n* junction on said one of the main surfaces of the semiconductor substrate, light which energizes the device being not substantially transmitted by said film; and a couple of main electrodes each in ohmic contact with a respective one of said first and second regions included in each of said light receiving elements; and wherein said semiconductor substrate is of *n*-type conductivity and an *n*-type region of a higher impurity concentration than said semiconductor substrate is formed in said semiconductor substrate at least a portion of which is located beneath the surface of each of said light receiving elements which is directly opposite to that respective surface portion by way of which light enters.

3. A light receiving semiconductor device comprising:

a semiconductor substrate including a plurality of light receiving elements arranged in a certain spaced relationship with respect to each other, each of said light receiving elements having a light receiving side exposed to one of said main surfaces of said semiconductor substrate, each of said light receiving elements including a first region of one conductivity type, a second region of the conductivity type opposite to that of said first region, and at least one *p-n* junction formed between said first region and said second region, said second region being adjacent to said first region and the edge of the p-n junction being exposed to said one of said main surfaces;

a plurality of films each formed all over the opposed portion between said light-receiving elements and apart from said edge of the p-n junction on said one of the main surfaces of the semiconductor substrate, light which energizes the device being not substantially transmitted by said film; and a couple of main electrodes each in ohmic contact with a respective one of said first and second regions included in each of said light receiving elements; and wherein said semiconductor substrate is of *n*-type conductivity and an *n*-type of a higher impurity concentration than said semiconductor substrate is formed is said substrate between said light receiving elements and apart from said *p-n* junction and which is located in the surface of each of said light receiving elements which is directly opposite to that respective surface portion by way of which light enters.

4. A light receiving semiconductor device according to claim 2, in which each of said films is made of a conductive material and in ohmic contact with said semiconductor substrate.

5. A light receiving semiconductor device according to claim 4, in which said *n*-type region of a higher impurity concentration than said semiconductor substrate is also formed between said light receiving elements and apart from said *p-n* junction.

6. A light receiving semiconductor device according to claim 2, in which each of said films is made of metal and a Schottky barrier is formed between said metal film and said semiconductor substrate.

7. A light receiving semiconductor device according to claim 2, in which said Schottky barriers are electrically short-circuited to each other.

8. A light receiving semiconductor device according to claim 2, in which an isolated region of a conductivity type opposite to that of said semiconductor substrate is buried in each portion of said semiconductor substrate between said light receiving elements and apart from said p-n junction, said isolated region being exposed to said one of said main surfaces of said semiconductor substrate.

9. A light receiving semiconductor device according to claim 8, in which each p-n junction formed between said semiconductor substrate and said isolated region is electrically short-circuited.

10. A light receiving semiconductor device according to claim 3, in which each of said films is made of metal and a Schottky barrier is formed between said metal film and said semiconductor substrate.

11. A light receiving semiconductor device according to claim 3, in which an isolated region of a conductivity type opposite to that of said semiconductor substrate is buried in each portion of said semiconductor substrate between said light receiving elements and apart from said *p-n* junction, said isolated region being exposed to said one of said main surfaces of said semiconductor substrate.

12. A light receiving semiconductor device according to claim 1, wherein said higher impurity concentration *n*-type region extends to said directly opposite surface.

13. A light receiving semiconductor device according to claim 1, wherein said higher impurity concentration *n*-type region is buried in said substrate spaced apart from said directly opposite surface.

14. A light receiving semiconductor device according to claim 2, wherein said higher impurity concentration

*n*-type region extends to said directly opposite surface.

15. A light receiving semiconductor device according to claim 2, wherein said higher impurity concentration *n*-type region is buried in said substrate spaced apart from said directly opposite surface.

16. A light receiving semiconductor device according to claim 3, wherein said higher impurity concentration *n*-type region extends to said directly opposite surface.

17. A light receiving semiconductor device according to claim 3, wherein said higher impurity concentration *n*-type region is buried in said substrate spaced apart from said directly opposite surface.

18. A light receiving semiconductor device according to claim 1, in which an n-type region of a higher impurity concentration than said semiconductor substrate is formed between said light receiving elements of the semiconductor substrate and apart from said p-n junction.

* * * * *